US009188656B2

(12) United States Patent
Yui et al.

(10) Patent No.: US 9,188,656 B2
(45) Date of Patent: Nov. 17, 2015

(54) MAGNETIC RESONANCE IMAGING APPARATUS AND MAGNETIC RESONANCE IMAGING METHOD

(75) Inventors: Masao Yui, Otawara (JP); Hiroshi Kusahara, Kyoto (JP)

(73) Assignees: KABUSHIKI KAISHA TOSHIBA, Tokyo (JP); TOSHIBA MEDICAL SYSTEMS CORPORATION, Tochigi (JP)

( * ) Notice: Subject to any disclaimer, the term of this patent is extended or adjusted under 35 U.S.C. 154(b) by 769 days.

(21) Appl. No.: 13/414,073

(22) Filed: Mar. 7, 2012

(65) Prior Publication Data

US 2012/0235676 A1 Sep. 20, 2012

(30) Foreign Application Priority Data

Mar. 15, 2011 (JP) .................................. 2011-056450
Feb. 7, 2012 (JP) .................................. 2012-024569

(51) Int. Cl.
*G01R 33/24* (2006.01)
*G01R 33/32* (2006.01)
*G01R 33/565* (2006.01)
*G01R 33/561* (2006.01)

(52) U.S. Cl.
CPC ...... *G01R 33/56518* (2013.01); *G01R 33/5616* (2013.01)

(58) Field of Classification Search
CPC ...................... G01R 33/56518; G01R 33/5616
USPC ............................ 324/300–322; 600/407–422
See application file for complete search history.

(56) References Cited

U.S. PATENT DOCUMENTS

| 4,950,994 A | 8/1990 | Glover et al. |
| 5,770,943 A * | 6/1998 | Zhou ............................ 324/307 |
| 5,864,233 A | 1/1999 | Zhou et al. |
| 6,335,620 B1 * | 1/2002 | Weissenberger ............. 324/307 |
| 8,080,997 B2 | 12/2011 | Kassai |
| 2006/0022674 A1 * | 2/2006 | Zhou et al. .................... 324/309 |
| 2009/0212772 A1 * | 8/2009 | Ookawa ........................ 324/309 |
| 2012/0098535 A1 * | 4/2012 | Kaneta et al. ................. 324/307 |

FOREIGN PATENT DOCUMENTS

| CN | 101669823 A | 3/2010 |
| JP | 2000-262485 | 9/2000 |
| JP | 2005-288026 | 10/2005 |
| JP | 2011-182916 | 9/2011 |

OTHER PUBLICATIONS

Office Action issued Jan. 30, 2014, in CN Patent Application No. 201210068015.2.

* cited by examiner

*Primary Examiner* — Melissa Koval
*Assistant Examiner* — Rishi Patel
(74) *Attorney, Agent, or Firm* — Nixon & Vanderhye P.C.

(57) ABSTRACT

According to one embodiment, a magnetic resonance imaging apparatus includes a data acquisition unit, an eddy magnetic field measuring unit and an imaging unit. The data acquisition unit is configured to acquire magnetic resonance signals at mutually different timings with applying a gradient magnetic field for generating an eddy magnetic field. The eddy magnetic field measuring unit is configured to acquire eddy magnetic field information including a time constant of the eddy magnetic field based on phase information of the magnetic resonance signals acquired at the timings. The imaging unit is configured to perform imaging under an imaging condition or a data processing condition according to the eddy magnetic field information.

14 Claims, 8 Drawing Sheets

MAGNETIC RESONANCE IMAGING APPARATUS AND MAGNETIC RESONANCE IMAGING METHOD

CROSS REFERENCE

This application is based upon and claims the benefit of priorities from Japanese Patent Application No. 2011-56450 filed on Mar. 15, 2011 and Japanese Patent Application No. 2012-24569 filed on Feb. 7, 2012; the entire contents of Japanese Patent Application No. 2011-56450 and Japanese Patent Application No. 2012-24569 are incorporated herein by reference.

FIELD

Embodiments described herein relate generally to a MRI (magnetic resonance imaging) apparatus and a magnetic resonance imaging method.

BACKGROUND

MRI is an imaging method which excites nuclear spin of an object set in a static magnetic field with a RF (radio frequency) signal having the Larmor frequency magnetically and reconstructs an image based on MR (magnetic resonance) signals generated due to the excitation.

In MRI, gradient magnetic fields are applied by gradient coils for acquiring MR signals. However, gradient magnetic fields are generated as pulse waves. Therefore, in case of being an electrical conductor around a gradient coil, an eddy current is generated in the electrical conductor when a gradient magnetic field rises and falls.

A heat shield of a static field magnet is included in examples of electrical conductors. When a super conducting magnet which generates a static magnetic field not less than 0.5 T is used as a static field magnet, a metallic container including liquid helium is provided as a heat shield in the super conducting magnet. Additionally, plural metallic containers such as a metallic container including liquid nitrogen are arranged around the liquid helium layer. Therefore, applying a gradient magnetic field produces an eddy current in each metallic container.

Temperatures, materials and sizes of respective metallic containers set in a static field magnet are different mutually. Therefore, an intensity and an attenuation time constant of eddy current generated in each metallic container has plural components. Generally, a time constant of an eddy current is in a wide range from 0.2 ms to 3 ms.

Meanwhile, an application of a gradient magnetic field also produces a self-eddy current in a gradient magnetic field coil material itself. The self-eddy current sometimes produces considerable strain of a magnetic field.

The eddy current as mentioned above produces an eddy magnetic field which changes due to the eddy current and generates a strain in a waveform of a gradient magnetic field outputted as a controlling value from a controller in a MRI apparatus. Then, the strain of the gradient magnetic field leads to an image artifact.

Accordingly, an Actively Shielded Gradient Coil (ASGC) to suppress generation of an eddy magnetic field is devised. Alternatively, compensation of an eddy magnetic field which corrects a waveform of a gradient magnetic field strained by an eddy magnetic field is devised. In principle, ASGC makes it possible to reduce an intensity of an eddy magnetic field substantially.

However, practically, it is not possible to prevent a minute eddy magnetic field from being generated for reasons such as production error of an ASGC and discrete arrangement of coil wires. Therefore, in the case of using a high-speed imaging method such as an EPI (echo planar imaging) method, it is possible to generate artifact in an image by the presence of a slight eddy magnetic field. Then, it is preferable to perform compensation of an eddy magnetic field even if a gradient magnetic field is applied with an ASGC.

The method to adjust a waveform of a gradient magnetic field set as a pulse sequence so as to cancel an eddy magnetic field is devised as another technology of suppressing an eddy magnetic field. For example, DWI (diffusion weighted imaging) is performed by an EPI sequence while applying an MPG (motion probing gradient) pulse. The MPG pulse is an intensive gradient magnetic field pulse. Therefore, a technology to adjust a gradient magnetic field other than an MPG pulse in an EPI sequence so as to cancel an eddy magnetic field generated due to the MPG pulse is suggested.

It is significant to measure intensities, time constants and a spatial distribution of eddy magnetic fields in advance with satisfactory accuracy in order to perform compensation of the eddy magnetic fields precisely. For example, in the case of performing DWI, it is significant to measure an eddy magnetic field having a time constant from 0.2 ms to 30 ms with satisfactory accuracy. Intensities and time constants of eddy magnetic fields can be obtained in accordance with phase shift information of MR signals acquired by a pulse sequence for measuring the eddy magnetic fields.

On the other hand, recently, an MRI apparatus which can generate static magnetic field intensity not less than 3 T becomes widely used. Under the high magnetic field as mentioned above, an influence to attenuation of a MR signal intensity by transverse relaxation star ($T2^*$) relaxation may be not negligible. That is, both phase shifts by eddy magnetic fields and $T2^*$ attenuation occur in MR signals. In this case, it becomes difficult to obtain intensities and time constants of eddy magnetic fields from phase shift amounts of MR signals precisely. Especially, when DWI is performed, it becomes more difficult to measure intensities and time constants of eddy magnetic fields with high accuracy since a time constant of an eddy magnetic field becomes equivalent to that of $T2^*$ attenuation.

That is, it is difficult to measure intensities and time constants of eddy magnetic fields, each having a time constant from 0.2 ms to 30 ms which is equivalent to that of $T2^*$ attenuation especially, with satisfactory accuracy under a high magnetic field not less than 3 T with a conventional technology. Not only under a high magnetic field, it is desired to measure intensities and time constants of eddy magnetic fields with satisfactory accuracy.

BRIEF DESCRIPTIONS OF DRAWINGS

Figure 1:
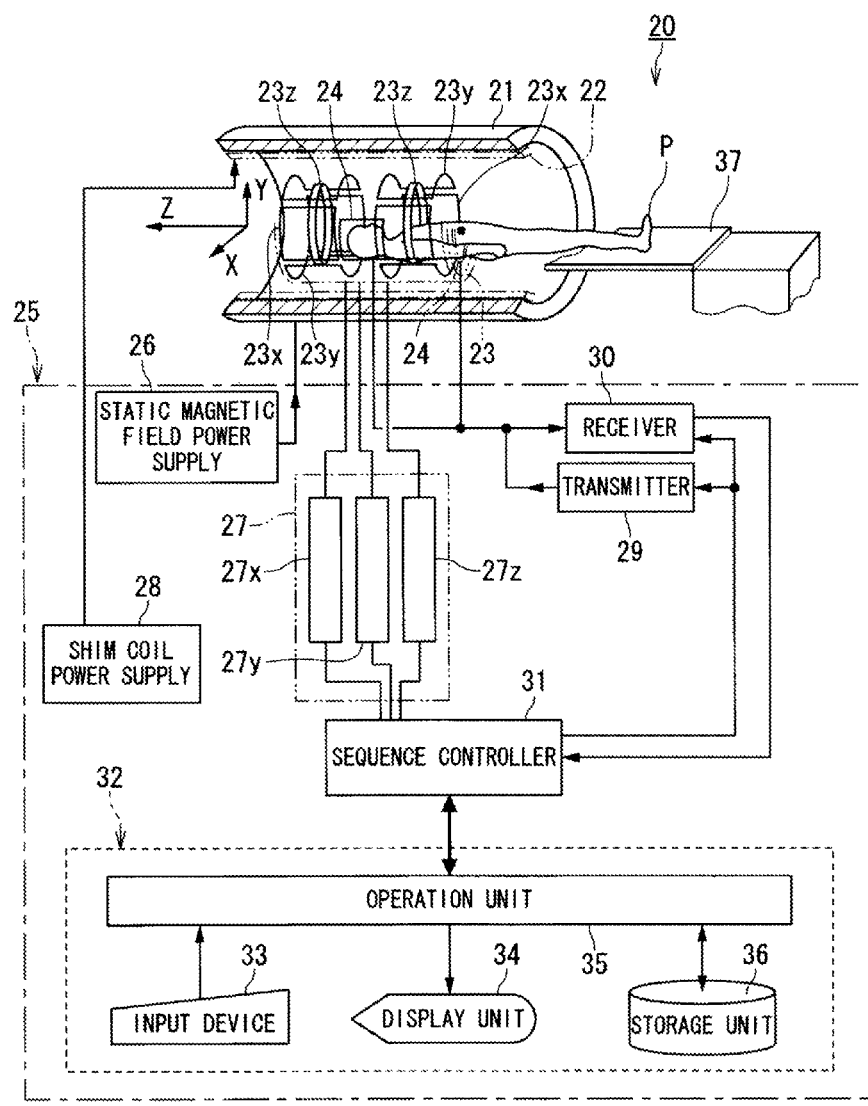
FIG. 1 is a block diagram showing a magnetic resonance imaging apparatus according to the first embodiment of the present invention.
Figure 7:
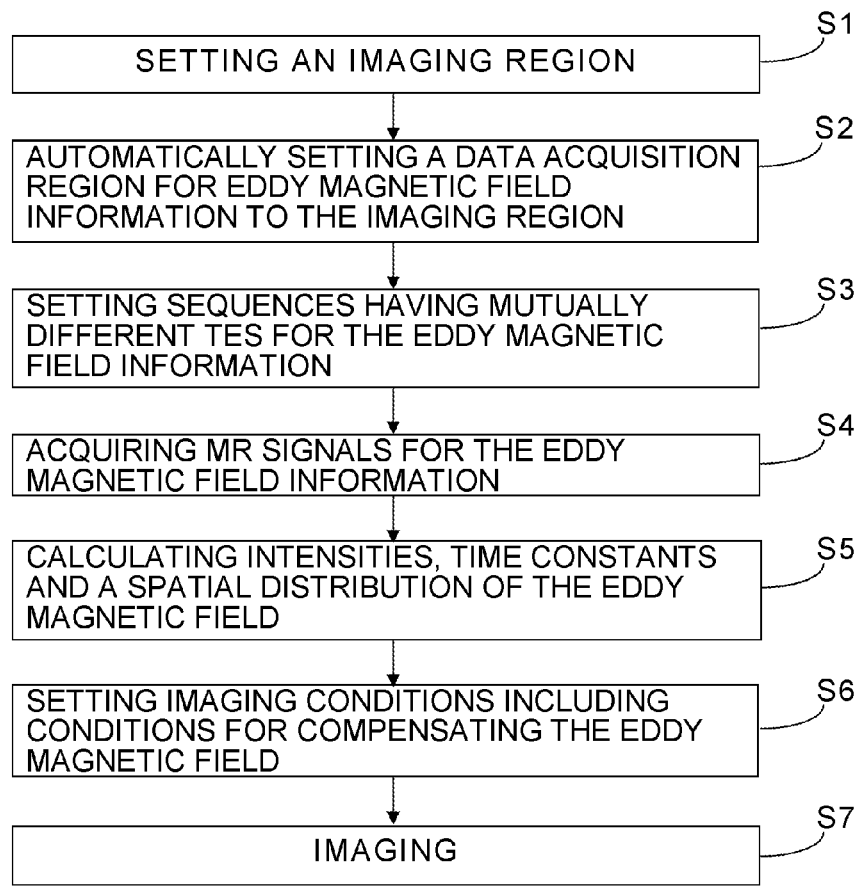
Figure 8:
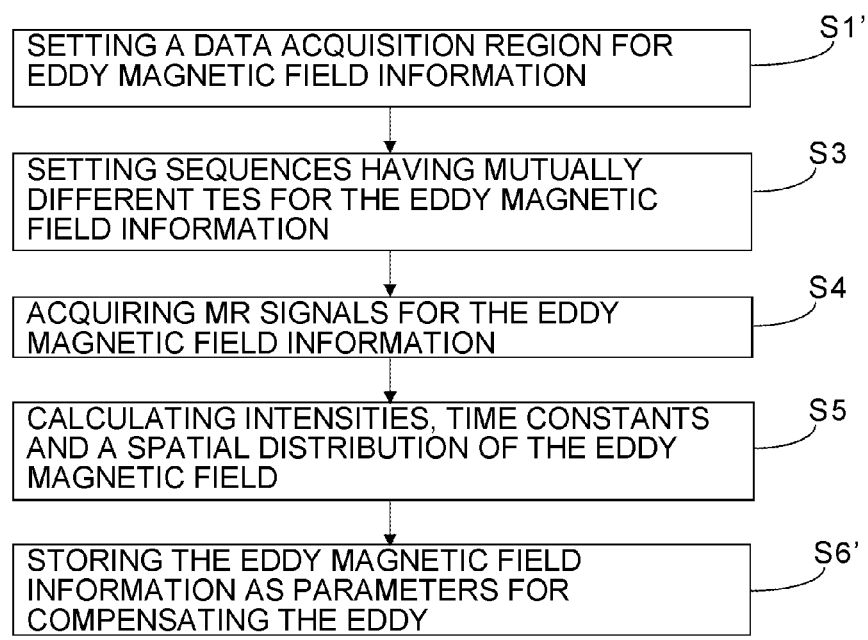

FIG. 7 is a flow chart showing a flow for imaging with measuring intensities and time constants of eddy magnetic fields by the magnetic resonance imaging apparatus shown in FIG. 1; and FIG. 8 is a flow chart showing a flow for measuring intensities and time constants of eddy magnetic fields to store the intensities and the time constants as apparatus parameters for compensating eddy magnetic fields by the magnetic resonance imaging apparatus shown in FIG. 1.

DETAILED DESCRIPTION

In general, according to one embodiment, a magnetic resonance imaging apparatus includes a data acquisition unit, an eddy magnetic field measuring unit and an imaging unit. The data acquisition unit is configured to acquire magnetic resonance signals at mutually different timings while applying a gradient magnetic field for generating an eddy magnetic field. The eddy magnetic field measuring unit is configured to acquire eddy magnetic field information including a time constant of the eddy magnetic field based on phase information of the magnetic resonance signals acquired at the timings. The imaging unit is configured to perform imaging under an imaging condition or a data processing condition according to the eddy magnetic field information.

Further, according to another embodiment, a magnetic resonance imaging method includes acquiring magnetic resonance signals at mutually different timings while applying a gradient magnetic field for generating an eddy magnetic field; acquiring eddy magnetic field information including a time constant of the eddy magnetic field based on phase information of the magnetic resonance signals acquired at the timings; and performing imaging under an imaging condition or a data processing condition according to the eddy magnetic field information.

A magnetic resonance imaging apparatus and a magnetic resonance imaging method according to embodiments of the present invention will be described with reference to the accompanying drawings.

First Embodiment

FIG. 1 is a block diagram showing a magnetic resonance imaging apparatus according to the first embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit a RF signal given from the transmitter 29 to the object P. The reception RF coil 24 has a function to receive a MR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, application period and application timing of the pulse electric current which should be applied to the gradient power supply 27

The sequence controller 31 is also configured to give raw data to the computer 32. The raw data is complex data obtained through the detection of a MR signal and A/D (analog to digital) conversion to the MR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a MR signal given from the RF coil 24 and performing predetermined signal processing and A/D converting to the MR signal detected. The receiver 30 also has a function to give the generated raw data to the sequence controller 31.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 2:
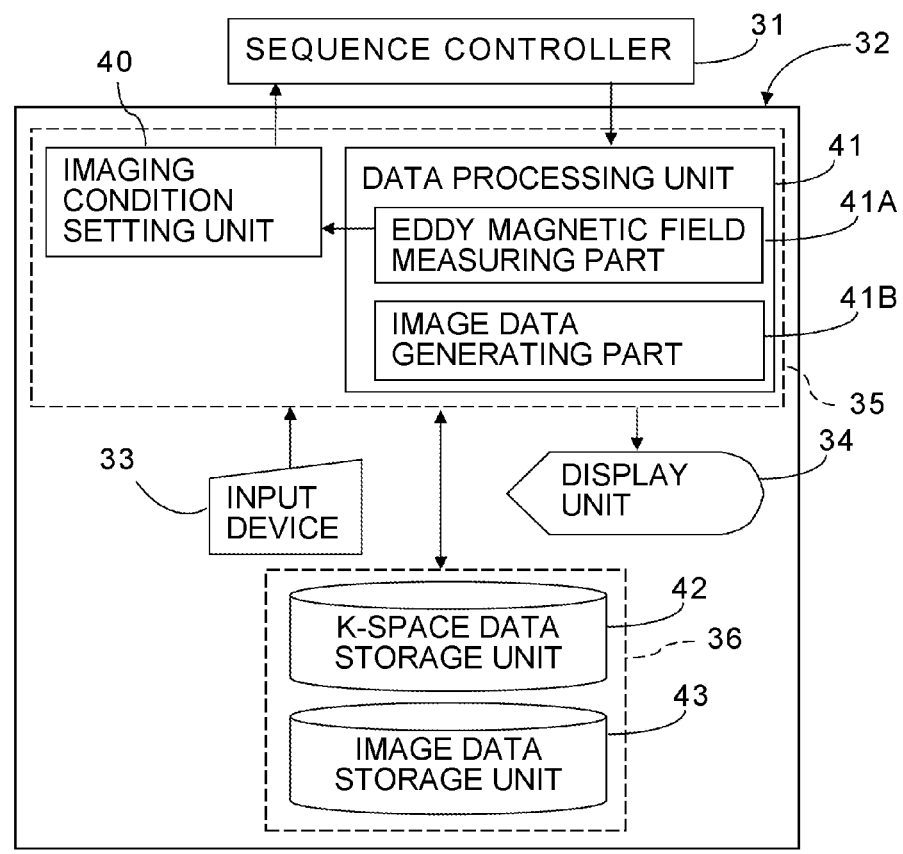
FIG. 2 is a functional block diagram of the computer shown in FIG. 1.

FIG. 2 is a functional block diagram of the computer 32 shown in FIG. 1.

The operation unit 35 of the computer 32 functions as an imaging condition setting unit 40 and a data processing unit 41 by executing the programs stored in the storage unit 36. The data processing unit 41 has an eddy magnetic field measuring part 41A and an image data generating part 41B. In addition, the storage unit 36 functions as a k-space data storage unit 42 and an image data storage unit 43.

The imaging condition setting unit 40 has a function to set imaging conditions including a pulse sequence in accordance with instruction information from the input device 33 and output the set imaging conditions to the sequence controller 31. Especially, the imaging condition setting unit 40 has a function to set data acquisition conditions of MR signals for measuring intensities and time constants in attenuation of eddy magnetic fields generated by applying gradient magnetic fields. The data acquisition conditions for obtaining eddy magnetic field information including intensities and time constants in attenuation of eddy magnetic fields can be set as conditions to acquire MR signals according to plural pulse sequences corresponding to plural TEs (echo times) respectively.

Figure 3:
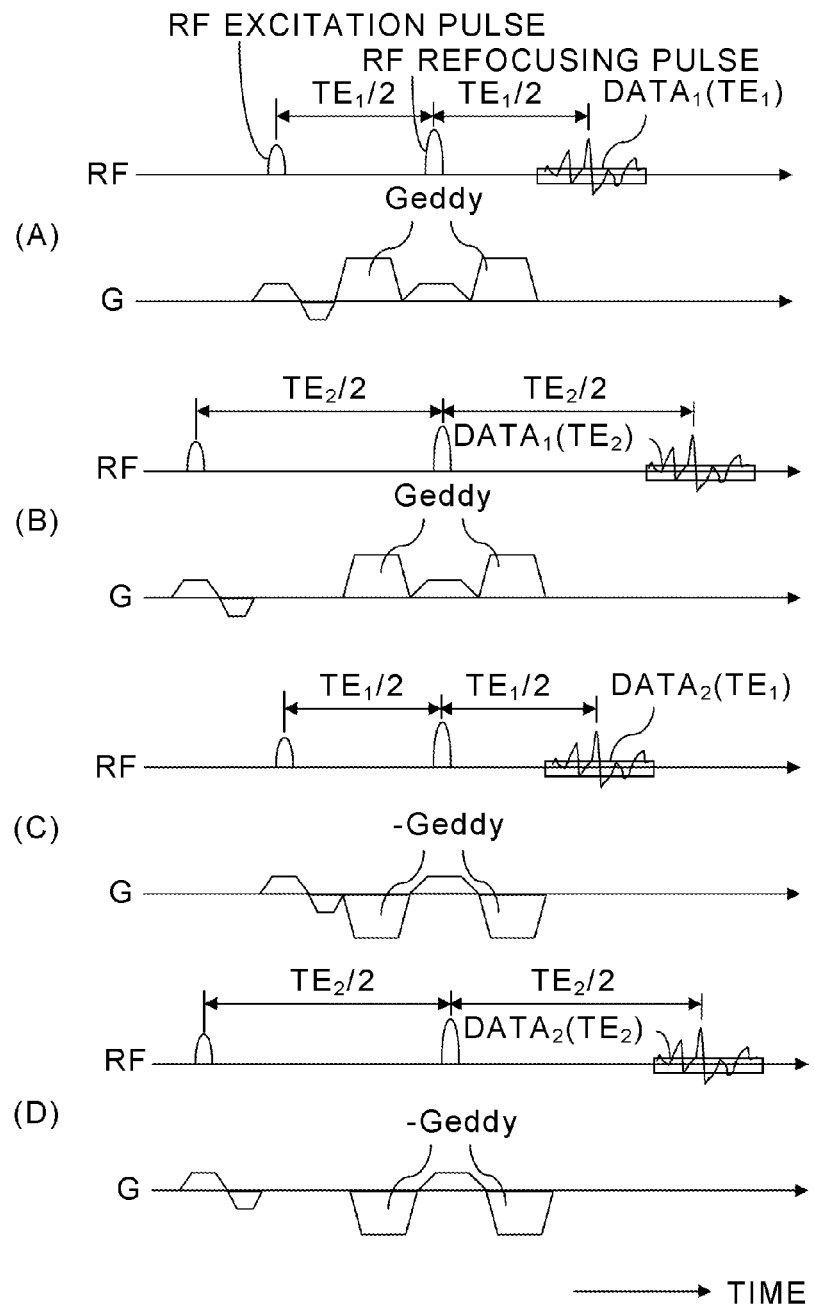
FIG. 3 is a sequence chart to show an example of sequences, for measuring intensities and time constants of eddy magnetic fields, set in the imaging condition setting unit shown in FIG. 2.

FIG. 3 is a sequence chart to show an example of sequence, for measuring intensities and time constants of eddy magnetic fields, set in the imaging condition setting unit 40 shown in FIG. 2.

Each transverse axis shows time, RF shows RF transmission pulses and MR reception echo signals and G shows gradient magnetic field pulses in FIGS. 3 (A), (B), (C) and (D) respectively. For example, four SE (spin echo) sequences shown in FIGS. 3 (A), (B), (C) and (D) can be set as sequences for measuring intensities and time constants of eddy magnetic fields in the imaging condition setting unit 40. An order of the four sequences shown in FIGS. 3 (A), (B), (C) and (D) is arbitrary.

As shown in FIG. 3 (A), a RF refocusing pulse is applied with a gradient magnetic field for slice selection at the timing when one-half of the first echo time $TE_1$ is passed after applying a RF excitation pulse with a gradient magnetic field for slice selection. Then, MR echo signals are acquired as reception data $DATA_1(TE_1)$ in the period according to the first echo time $TE_1$.

An acquisition period of the reception data $DATA_1(TE_1)$ is set to a period when gradient magnetic fields including a readout (RO) gradient magnetic field are not applied. Furthermore, a reception period of the reception data $DATA_1(TE_1)$ is set in a period when a phase shift generated in a MR echo signal by $T2^*$ attenuation is negligible. The timing at which the effect of $T2^*$ attenuation becomes the minimum is TE.

Therefore, the reception period of the reception data $DATA_1(TE_1)$ is in a certain period before and after the first echo time $TE_1$. That is, MR echo signals are acquired as the reception data $DATA_1(TE_1)$ in a period including a timing at which the first echo time $TE_1$ is passed from an application timing of a RF excitation pulse.

Then, eddy generation gradient magnetic field pulses Geddy for generating eddy magnetic fields are applied before and after applying the RF refocusing pulse. Areas of the eddy generation gradient magnetic field pulses Geddy are set to areas which can be considered to be mutually the same before and after applying the RF refocusing pulse. Therefore, eddy generation gradient magnetic field pulses Geddy having mutually different pulse waveforms may be applied before and after applying the RF refocusing pulse so long as the areas are equal though FIG. 3 shows an example of applying the eddy generation gradient magnetic field pulses Geddy having a same pulse waveform before and after applying the RF refocusing pulse respectively. In addition, the different number of eddy generation gradient magnetic field pulses Geddy may be applied before and after applying the RF refocusing pulse so long as sums of areas are mutually same.

Next, as shown in FIG. 3 (B), a SE sequence of which TE is set to the second echo time $TE_2$ different from the first echo time $TE_1$ is set as a sequence for measuring the intensities and the time constants of the eddy magnetic fields. That is, a SE sequence substantially same as the SE sequence shown in FIG. 3 (A), except for the point that the TE is changed from the first echo time $TE_1$ to the second echo time $TE_2$, is set. Therefore, waveforms of the respective pulse consisting of the SE sequence shown in FIG. 3 (B) are same as those of the respective pulse consisting of the SE sequence shown in FIG. 3 (A).

Consequently, in the SE sequence shown in FIG. 3 (B), a RF refocusing pulse is applied with a gradient magnetic field for slice selection at the timing when ½ of the second echo time $TE_2$ is passed after applying the RF excitation pulse with a gradient magnetic field for slice selection. Then, MR echo signals are acquired as reception data $DATA_1(TE_2)$ in a period according to the second echo time $TE_2$.

The gradient magnetic fields including a RO gradient magnetic field are not applied in an acquisition period of the reception data $DATA_1(TE_2)$. Furthermore, a reception period of the reception data $DATA_1(TE_2)$ is set to a period in which a phase shift of generated in a MR echo signal by $T2^*$ attenuation is negligible.

That is, the reception period of the reception data $DATA_1(TE_2)$ is set in a certain period before and after the second echo time $TE_2$. In other words, the MR echo signals are acquired as the reception data $DATA_1(TE_2)$ in a period including the timing at which the second echo time $TE_2$ is passed from the application timing of the RF excitation pulse.

The eddy generation gradient magnetic field pulses Geddy having the same waveforms as those of the SE sequence shown in FIG. 3 (A) are applied before and after applying the RF refocusing pulse. The relative difference in application time between each eddy generation magnetic field pulse Geddy and the RF refocusing pulse is also same as that of the SE sequence shown in FIG. 3 (A).

Consequently, in both the reception data $DATA_1(TE_1)$ and $DATA_1(TE_2)$ which are acquired corresponding to the first echo time $TE_1$ and the second echo time $TE_2$ respectively, phase shifts by $T2^*$ attenuation are negligible while the phases shift by influences of the eddy magnetic fields generated by the eddy generation gradient magnetic field pulses Geddy. Furthermore, the center times of the reception periods of the respective reception data $DATA_1$ ($TE_1$) and $DATA_1$ ($TE_2$) become timings at which mutually different times are elapsed from the application time of the eddy generation gradient magnetic field pulses Geddy.

Therefore, by combining the reception data $DATA_1(TE_1)$ with the reception data $DATA_1(TE_2)$, reception data $DATA_1$ of which phase shifts by T2* attenuation are negligible can be obtained over a period in which phase shifts by T2* attenuation cannot be disregarded if a single RF excitation pulse were applied one time to acquire the reception $DATA_1$.

Accordingly, the first echo time $TE_1$ and the second echo time $TE_2$ are determined so that the reception data $DATA_1$ obtained by combining the reception data $DATA_1(TE_1)$ with the reception data $DATA_1(TE_2)$, acquired by the respective SE sequences respectively, becomes reception data from which time constants of the eddy magnetic fields generated by the eddy generation gradient magnetic field pulses Geddy can be obtained with satisfactory accuracy.

Therefore, the first echo time $TE_1$ and the second echo time $TE_2$ are determined so that the respective reception periods of the reception data $DATA_1(TE_1)$ and $DATA_1(TE_2)$ in the respective SE sequences shown in FIGS. 3 (A) and (B) become adjacent mutually or overlapped by an appropriate margin amount. FIG. 3 shows an example of setting the second echo time $TE_2$ to be longer than the first echo time $TE_1$ by the approximately twice data reception period so that the reception data $DATA_1(TE_2)$, is later temporally than the reception data $DATA_1(TE_1)$ acquired by the SE sequence shown in (A), acquired by the SE sequence shown in (B).

By the way, phase shifts due to a factor, such as nonuniformity of the static magnetic field, other than eddy magnetic fields due to T2* attenuation and the eddy generation gradient magnetic field pulses Geddy may occur in the reception data $DATA_1(TE_1)$ and $DATA_1(TE_2)$ acquired in the periods including the first echo time $TE_1$ and the second echo time $TE_2$ respectively. Accordingly, the phase shifts due to the factors except for the eddy magnetic fields due to the T2* attenuation and the eddy generation gradient magnetic field pulses Geddy can be canceled by obtaining differences in phase from reception data acquired by performing SE sequences in which intensities of the eddy generation gradient magnetic field pulses Geddy are varied.

FIGS. 3 (C) and (D) show SE sequences in which the polarity of the eddy generation gradient magnetic field pulses Geddy in the SE sequences shown in FIGS. 3 (A) and (B) respectively is inverted. That is, in the SE sequence shown in FIG. 3 (C), MR echo signals influenced by eddy magnetic fields due to the eddy generation gradient magnetic field pulses –Geddy are acquired as reception data $DATA_2(TE_1)$ in a period including a timing at which the first echo time $TE_1$ is passed from an application timing of a RF excitation pulse. Meanwhile, in the SE sequence shown in FIG. 3 (D), MR echo signals influenced by eddy magnetic fields due to the eddy generation gradient magnetic field pulses –Geddy are acquired as reception data $DATA_2(TE_2)$ in a period including a timing at which the second echo time $TE_2$ is passed from an application timing of a RF excitation pulse.

Instead of inverting the polarity of the eddy generation gradient magnetic field pluses Geddy as shown by FIGS. 3 (C) and (D), intensities of the eddy generation gradient magnetic field pluses Geddy may be set to zero. Alternatively, absolute values of intensities of the eddy generation gradient magnetic field pluses Geddy may be changed. The intensities and time constants in attenuation of the eddy magnetic fields can be measured with practical accuracy by setting the respective SE sequences shown in (C) and (D) in addition to (A) and (B) of FIG. 3 as data acquisition conditions.

Note that, plural SE sequences in which mutually different three TEs and above are set may be set as data acquisition conditions. That is, so long as at least two SE sequences having mutually different TEs are set with keeping the application patterns of RF refocusing pulses, SS gradient magnetic fields and eddy generation gradient magnetic field pulses Geddy mutually same independently of the TEs, data for measuring intensities and time constants in attenuation of eddy magnetic fields can be acquired. When the number of TEs is increased, it becomes possible to obtain longer time constants. If influence of RF refocusing pulses and SS gradient magnetic fields to measurement is negligible, it is possible naturally to also change application patterns of the RF refocusing pulses, the SS gradient magnetic fields and the eddy generation gradient magnetic field pulses Geddy slightly for the respective TEs.

FIG. 3 shows an example of setting an application direction of the eddy generation gradient magnetic field pulses Geddy to an application direction of the slice selection (SS) gradient magnetic field pulses. However, eddy generation gradient magnetic field pulses Geddy may be applied in an appropriate application direction so as to correspond to imaging conditions for an imaging scan and data for measuring intensities and time constants of eddy magnetic fields can be acquired.

Further, data acquisition conditions may be set so that a gradient magnetic field pulse for phase encode (PE) is applied between the RF excitation pulse and the RF refocusing pulse or immediately after the RF refocusing pulse in each SE sequence shown in FIG. 3 so as to perform the SE sequence repeatedly with mutually different phase encode amounts. In this case, it becomes possible to obtain a spatial distribution of the intensity and time constants of the eddy magnetic fields by acquiring reception data $DATA_1(TE_1)$, $DATA_1(TE_2)$, $DATA_2(TE_1)$ and $DATA_2(TE_2)$ corresponding to the respective phase encode amounts in a PE-axis direction.

Furthermore, in each SE sequence shown in FIG. 3, a spoiler gradient magnetic field pulse (also referred to a crasher pulse) for removing FID (free induction attenuation) signals may be applied subsequent to the RF refocusing pulse. This is equivalent to making the period in which reception data $DATA_1(TE_1)$, $DATA_1(TE_2)$, $DATA_2(TE_1)$ and $DATA_2(TE_2)$ can be acquired without influence of the T2* attenuation be longer compared to a case where a spoiler gradient magnetic field pulse is not applied.

When a spoiler gradient magnetic field pulse is applied, it is preferable that a relative time of the spoiler gradient magnetic field pulse from an application time of a RF refocusing pulse and a pulse waveform of the spoiler gradient magnetic field pulse are set to be common to the respective SE sequences shown in FIGS. 3 (A), (B), (C) and (D). This is for obtaining intensities and time constants of eddy magnetic fields with high accuracy by standardizing data acquisition conditions for the reception data $DATA_1(TE_1)$, $DATA_1(TE_2)$, $DATA_2(TE_1)$ and $DATA_2(TE_2)$.

On the other hand, the same data acquisition conditions as imaging conditions for an imaging scan as possible may be also set for obtaining intensities, time constants and a spatial distribution of eddy magnetic fields with higher accuracy. DWI is a representative example in imaging methods which are influenced significantly by eddy magnetic field. Therefore, a data acquisition sequence for measuring intensities, time constants and a spatial distribution of eddy magnetic field generated due to applying an MPG pulse of an EPI sequence for DWI will be described for example.

Figure 4:
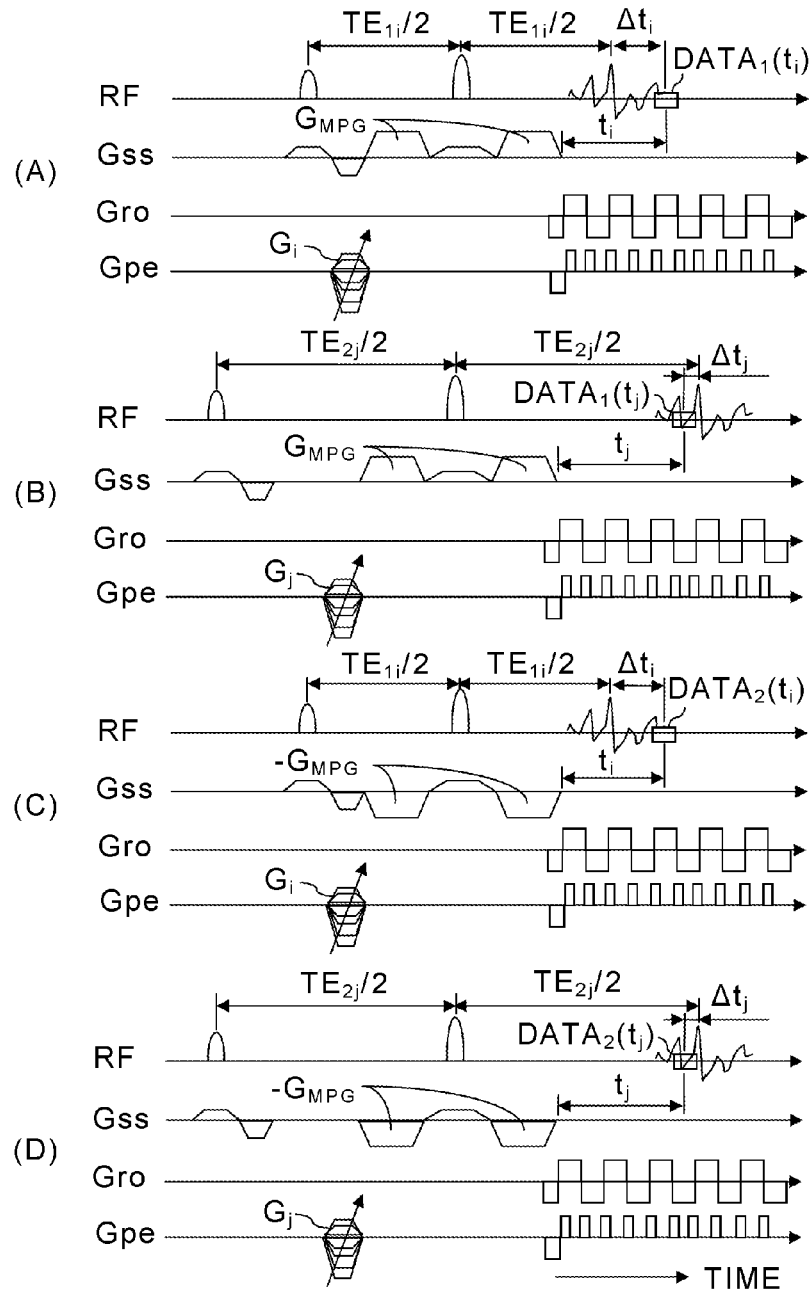
FIG. 4 is a sequence chart showing another example of sequences, for measuring intensities and time constants of eddy magnetic fields, set in the imaging condition setting unit shown in FIG. 2.

FIG. 4 is a sequence chart showing another example of sequences, for measuring intensities and time constants of eddy magnetic fields, set in the imaging condition setting unit 40 shown in FIG. 2.

In FIGS. 4 (A), (B), (C) and (D), each transverse axis shows time, RF shows RF transmission pulses and MR reception echo signals, Gss shows gradient magnetic field pulses applied in a SS direction, Gro shows gradient magnetic field pulses applied in a RO direction and Gpe shows gradient magnetic field pulses applied in a PE direction respectively.

All of (A), (B), (C) and (D) in FIG. 4 are EPI sequences for DWI with application of MPG pulses $G_{MPG}$. That is, a RF excitation pulse and a RF refocusing pulse are applied with a SS gradient magnetic field pulse.

In each of the EPI sequences shown in FIGS. 4 (A) and (C), the RF refocusing pulse is applied at a timing at which one-half of the first echo time $TE_{1i}$ is passed from the application timing of the RF excitation pulse and a peak of MR echo signals occurs at the timing at which the first echo time $TE_{1i}$ is passed. Meanwhile, in each of the EPI sequences shown in FIGS. 4 (B) and (D), the RF refocusing pulse is applied at a timing at which one-half of the second echo time $TE_{2j}$ is passed from the application timing of the RF excitation pulse and a peak of MR echo signals occurs at the timing at which the second echo time $TE_{2j}$ is passed.

Further, MPG pulses $G_{MPG}$ are applied before and after the RF refocusing pulse. The MPG pulses $G_{MPG}$ are major eddy generation gradient magnetic field pulses Geddy in a DWI sequence. As long as areas and application directions of the MPG pulses $G_{MPG}$ are mutually same before and after applying the RF refocusing pulse, pulse waveforms and pulse numbers of the MPG pulses $G_{MPG}$ may be mutually different before and after the RF refocusing pulse. Each of FIGS. 4 (A), (B), (C) and (D) shows an example of setting the EPI sequence so as to apply MPG pulses $G_{MPG}$, having a same pulse waveform, in a SS direction before and after the RF refocusing pulse.

In a case of an EPI sequence, it is also preferable to perform data acquisition while changing an intensity of the MPG pulse $G_{MPG}$ for the similar reason to that in the case of the SE sequences shown in FIG. 3. The EPI sequences shown in FIGS. 4 (C) and (D) are sequences of which the polarity of the MPG pulses $G_{MPG}$ in the EPI sequences shown in FIGS. 4 (A) and (B) respectively is inverted. Note that, it is preferable on the accuracy to conform intensities of MPG pulses applied in EPI sequences used in an imaging scan practically.

A RO gradient magnetic field pulse and a blip PE gradient magnetic field pulse are applied repeatedly subsequently to applying the MPG pulses $G_{MPG}$. That is, plural RO gradient magnetic field pulses with changing the polarity alternately and plural blip PE gradient magnetic field pulses having a same polarity are applied subsequently to the application of the MPG pulses $G_{MPG}$. Frequency encoding is performed by applying the RO gradient magnetic field pulses and a spatial frequency is given to each signal. Then, the data acquisition for obtaining eddy magnetic field information including intensities, time constants and a spatial distribution of eddy magnetic fields is performed in synchronization with a part of the plural RO gradient magnetic field pulses.

Furthermore, a PE gradient magnetic field pulse having a step-shaped pulse waveform is applied between the RF excitation pulse and the RF refocusing pulse. The respective EPI sequences are repeated with a constant repetition time (TR) and the apparatus is controlled so as to change the area of the step-shaped PE gradient magnetic field pulse by a predetermined amount once each EPI sequence is repeated.

The intensity of the step-shaped PE gradient magnetic field pulse is set so as to become possible to obtain a MR echo signal for obtaining the eddy magnetic field information with phase encoding by a desired phase encode amount. The MR echo signal received at each timing is subjected to phase encoding by a phase encode amount corresponding to a sum of respective areas of step-shaped PE gradient magnetic field pulses and blip-shaped PE gradient magnetic field pulses each having been applied before the reception timing. Therefore, an intensity of each step-shaped PE gradient magnetic field pulse is set to an intensity according to an application number of blip-shaped PE gradient magnetic field pulses each having been already applied at a reception timing of a MR echo signal for obtaining eddy magnetic field information, i.e., before receiving the MR echo signal for obtaining the eddy magnetic field information.

On the other hand, imaging parameters of each EPI sequence are set so that a timing to generate a MR echo signal for obtaining the eddy magnetic field information becomes a timing at which a predetermined time elapsed from the timing to finish the application of the MPG pulse $G_{MPG}$ subsequently to the RF refocusing pulse. Specifically, in the EPI sequence shown in FIG. 4 (A), the imaging parameters are set so that plural MR echo signals are acquired, at respective times elapsing by mutually different times $t_i$ from a termination timing of the MPG pulse $G_{MPG}$ application in a period in which influence of the T2* attenuation is negligible, as reception data $DATA_1(t_i)$ for obtaining the eddy magnetic field information by repeating the EPI sequence.

Meanwhile, in the EPI sequence shown in FIG. 4 (B), imaging parameter are set so that plural MR echo signals are acquired, at respective times elapsing by mutually different time $t_j$ from a termination timing of the MPG pulse $G_{MPG}$ application in a period in which influence of the T2* attenuation is negligible, as reception data $DATA_1(t_j)$ for obtaining the eddy magnetic field information by repeating the EPI sequence.

Then, the elapsed times $t_i$, $t_j$ are determined so that the reception data $DATA_1$ obtained by combining the reception data $DATA_1(t_i)$ with the reception data $DATA_1(t_j)$, corresponding to the elapsed times $t_i$ and $t_j$ from the termination timing of the MPG pulses $G_{MPG}$ application, becomes the reception data to be possible to obtain time constants of eddy magnetic fields generated by the MPG pulses $G_{MPG}$ with satisfactory accuracy.

In the EPI sequence shown in FIG. 4 (A), the imaging parameters for adjusting the generation timing of the reception data $DATA_1(t_i)$ include the first echo time $TE_{1i}$ and the time difference $\Delta t_i$ between the elapsed timing of the first echo time $TE_{1i}$ and the acquisition timing of reception data $DATA_1(t_i)$. Accordingly, in the EPI sequence shown in FIG. 4 (A), one or both of the first echo time $TE_{1i}$ and the time difference $\Delta t_i$ are set variably according to the acquisition timing of the reception data $DATA_1(t_i)$.

Similarly, in also the EPI sequence shown in FIG. 4 (B), one or both of the second echo time $TE_{2j}$ and the time difference $\Delta t_j$ are set variably according to the acquisition timing of the reception data $DATA_1(t_j)$. That is, the first echo time $TE_1$ and the second echo time $TE_2$ shown in FIG. 3 are fixed values while the first echo time $TE_{1i}$ and the second echo time $TE_{2j}$ shown in FIG. 4 can be variable values.

When the first echo time $TE_{1i}$ and the second echo time $TE_{2j}$ are constant in the respective EPI sequences shown in FIGS. 4 (A) and (B), the time differences $\Delta t_i$ and $\Delta t_j$ are set variably in the range in which the influence of T2* attenuation is negligible. That is, mutually different time differences $\Delta t_i$ and $\Delta t_j$ are set for the repeated EPI sequences. In this case, TE is set to two values of the first echo time $TE_{1i}$ and the second echo time $TE_{2j}$, and therefore, control can be simplified.

The number of reception data $DATA_1(t_i)$ and $DATA_1(t_j)$ acquired in the variable ranges of the time differences $\Delta t_i$ and $\Delta t_j$, i.e., a repeat count of the EPI sequence depends on conditions, such as an echo train space (ETS) and a spatial resolution, of the EPI sequence. That is, if the ETS is short, more reception data $DATA_1(t_i)$ and $DATA_1(t_j)$ can be acquired to make time constants of the eddy magnetic fields high accuracy. Specifically, it is possible to acquire several to dozens of pieces of reception data $DATA_1(t_i)$ and $DATA_1(t_j)$ according to the ETS.

On the contrary, in the EPI sequences shown in FIGS. 4 (A) and (B), only the first echo time $TE_{1i}$ and the second echo time $TE_{2j}$ may be changed with keeping the time differences $\Delta t_i$ and $\Delta t_j$ constantly zero. In this case, the first echo time $TE_{1i}$ and the second echo time $TE_{2j}$ are changed at a time interval corresponding to the ETS. The control allows to acquire all reception data $DATA_1(t_i)$ and $DATA_1(t_j)$ in the first echo time $TE_{1i}$ and the second echo time $TE_{2j}$ in which the influence of T2* attenuation is least.

FIG. 4 shows the example of setting variably not only the first echo time $TE_{1i}$ and the second echo time $TE_{2j}$ but also the time differences $\Delta t_i$ and $\Delta t_j$. That is, in the EPI sequence shown in FIG. 4 (A), the reception data $DATA_1(t_i)$ is acquired repeatedly with the first echo time $TE_{1i}$ which is shorter than the second echo time $TE_{2j}$ on average. Meanwhile, in the EPI sequence shown in FIG. 4 (B), the reception data $DATA_1(t_j)$ is acquired repeatedly with the second echo time $TE_{2j}$ which is longer than the first echo time $TE_{1i}$ on average.

The area of each step-shaped PE gradient magnetic field pulse mentioned above is adjusted so that the phase encode amounts of the respective reception data $DATA_1(t_i)$ and $DATA_1(t_j)$, acquired from a same spatial position by the EPI sequences shown in FIGS. 4 (A) and (B), become same. The numbers of the blip-shaped PE gradient magnetic field pulses applied before receiving the reception data $DATA_1(t_i)$ and $DATA_1(t_j)$ respectively are different between the respective EPI sequences shown in FIGS. 4 (A) and (B).

Therefore, the area of the step-shaped PE gradient magnetic field pulses are changed between the respective EPI sequences shown in FIGS. 4 (A) and (B) by a difference in area of the blip-shaped PE gradient magnetic field pulses. That is, the area and the pattern $G_i$ of change in area of the step-shaped PE gradient magnetic field pulse in the EPI sequence shown in FIG. 4 (A) are different from the area and the pattern $G_j$ of change in area of the step-shaped PE gradient magnetic field pulse in the EPI sequence shown in FIG. 4 (B). Further, the application timing of the step-shaped PE gradient magnetic field pulse shown in FIG. 4 (B) is set so as to be adjacent to the MPG pulse. However, it is possible to set the application timing of the step-shaped PE gradient magnetic field pulse shown in FIG. 4 (B) so as to be adjacent to the RF excitation pulse.

When the EPI sequences set as shown in FIGS. 4 (A), (B), (C) and (D) are performed, the reception data $DATA_1(t_i)$, $DATA_1(t_j)$, $DATA_2(t_i)$ and $DATA_2(t_j)$, of which phases are shifted by the influence of the eddy magnetic fields due to the MPG pulses $G_{MPG}$ and $-G_{MPG}$ which have mutually opposite polarities and on which influence of the T2* attenuation is negligible, can be acquired. In addition, it becomes possible to obtain spatial distributions of intensities and time constants of the eddy magnetic fields by controlling the step-shaped PE gradient magnetic field pulses to acquire the reception data $DATA_1(t_i)$, $DATA_1(t_j)$, $DATA_2(t_i)$ and $DATA_2(t_j)$ corresponding to the respective phase encode amounts in a PE axis direction.

Note that, in a case where it is not required to obtain spatial distributions of time constants and intensities of the eddy magnetic fields or in a case where the reduction of a data acquisition time is prior, an area of each step-shaped PE gradient magnetic field pulse in the respective EPI sequences shown in FIG. 4 may be set to a single fixed value corresponding to the reception timing of the reception data $DATA_1(t_i)$, $DATA_1(t_j)$, $DATA_2(t_i)$ or $DATA_2(t_j)$. That is, an area of each step-shaped PE gradient magnetic field pulse may be not changed with a step.

In this case, only reception data $DATA_1(t_i)$, $DATA_1(t_j)$, $DATA_2(t_i)$ and $DATA_2(t_j)$ corresponding to a single phase encode amount are acquired. This corresponds to that imaging in a PE direction is not performed, i.e., projection data in a PE direction is acquired.

As mentioned above, when data acquisition conditions for acquiring eddy magnetic field information are set on a basis of EPI sequences used in DWI practically, eddy magnetic fields generated in practical DWI can be reproduced. Therefore, it becomes possible to measure eddy magnetic field information much more precisely.

Note that, the DWI sequences shown in FIG. 4 are an example of applying the MPG pulses $G_{MPG}$ and $-G_{MPG}$ in a SS direction. However, it is preferable that data acquisition conditions for applying MPG pulses, having various intensities corresponding to an imaging scan, in possibly applied directions are set for obtaining eddy magnetic field information, from a perspective of high accuracy.

The imaging condition setting unit 40 has a function to set data acquisition conditions as described above. In addition, the imaging condition setting unit 40 is configured to set imaging conditions for an imaging scan based on eddy magnetic field information obtained in the eddy magnetic field measuring part 41A. For example, imaging conditions including waveforms of gradient magnetic field pulses can be set so that possibly generated eddy magnetic fields are canceled based on intensities, time constants and a spatial distribution of eddy magnetic fields.

Examples of a method of canceling eddy magnetic fields include not only a method for adjusting pulse sequences such as EPI sequences but a method for outputting correction information of gradient magnetic field waveforms or eddy magnetic field information for obtaining the correction information of the gradient magnetic field waveforms to an eddy compensation circuit included in the gradient power supply 27 and/or the sequence controller 31 to control them without changing pulse sequences, and the like.

On the contrary, the imaging condition setting unit 40 can have the function to automatically set data acquisition conditions for obtaining eddy magnetic field information based on imaging conditions for imaging. As mentioned above, it is preferable to set data acquisition conditions, which are more identical to imaging conditions for imaging, for obtaining eddy magnetic field information including intensities, time constants and a spatial distribution of eddy magnetic fields, in order to obtain the eddy magnetic field information with higher accuracy.

For example, data acquisition conditions can be set so that MR signals for obtaining eddy magnetic field information are acquired by applying RO gradient magnetic fields at same timings as those of the RO gradient magnetic fields applied for imaging and applying eddy generation gradient magnetic field pulses Geddy at same timings as those of predetermined gradient magnetic fields, such as MPG pulses, except for the RO gradient magnetic fields and applied for imaging. That is, application timings of RO gradient magnetic fields and application timings of gradient magnetic field pulses dominant for generation of eddy magnetic fields can be common between a pulse sequence for imaging and a pulse sequence for obtaining eddy magnetic field information. Note that, an application timing of a gradient magnetic field can be specified by an elapsed time from an application timing of a RF excitation pulse to the application timing of the gradient magnetic field, a time from the application timing of the gradient magnetic field to a TE, or the like.

In this case, it is preferable to set conditions by which RO gradient magnetic fields for acquiring MR signals for obtaining eddy magnetic field information are applied with same intensities as those of RO gradient magnetic fields applied for imaging and eddy generation gradient magnetic field pulses Geddy are applied with same intensities as those of the predetermined gradient magnetic fields applied for imaging. That is, intensities of RO gradient magnetic fields and intensities of gradient magnetic field pulses dominant to generation of eddy magnetic fields can be common between pulse sequences for imaging and pulse sequences for obtaining eddy magnetic field information.

As another condition, a data acquisition region for obtaining eddy magnetic field information can be set so that MR signals for obtaining the eddy magnetic field information are acquired from a same region as an imaging region to be an imaging target. In this case, when information designating an imaging region for imaging is inputted from the input device 33, the imaging condition setting unit 40 can be configured to automatically set an acquisition region of the MR signals for obtaining the eddy magnetic field information in accordance with the information designating the imaging region for imaging.

As mentioned above, it becomes possible to obtain eddy magnetic field information with higher accuracy by acquiring MR signals, for obtaining the eddy magnetic field information, from a same region as an imaging region to be an imaging target. Specifically, accuracy of eddy magnetic field information can be improved compared to a case of acquiring MR signals for obtaining the eddy magnetic field information from limited regions such as vicinity of special axes.

Note that, when an imaging region to be an imaging target and an acquisition region of MR signals for obtaining eddy magnetic field information are set to be mutually same, a different resolution can be set as a resolution for data for obtaining the eddy magnetic field information. Practically, resolutions of data for obtaining eddy magnetic field information in arbitrary axis directions can be lower than those of imaging data. This allows to reduce a data amount to be acquired and a data acquisition time for obtaining eddy magnetic field information.

When a resolution of data for obtaining eddy magnetic field information is set to be lower than a resolution of imaging data, acquisition positions of MR signals are changed though an imaging region to be an imaging target is same as an acquisition region of MR signals for obtaining eddy magnetic field information. For example, in case of reducing a resolution in a slice direction of MR signals for obtaining eddy magnetic field information, a slice interval for obtaining the eddy magnetic field information becomes lager than that for imaging.

Meanwhile, resolutions of data for obtaining eddy magnetic field information may be set to be same as those for imaging data. In this case, the eddy magnetic field information can be obtained with more satisfactory accuracy. Note that, when a resolution of data for obtaining eddy magnetic field information is set be same as that for imaging data at least in a slice direction, center positions and directions of respective slices become common between imaging conditions for imaging and data acquisition conditions for the eddy magnetic field information.

The eddy magnetic field information can be obtained prior to each imaging. Alternatively, the eddy magnetic field information may be regularly obtained independently of specific imaging. In this case, a data acquisition region of MR signals for obtaining eddy magnetic field information can be set so that the MR signals for obtaining the eddy magnetic field information are acquired from a reference region smaller than an imaging region possibly set for imaging.

Figure 5:
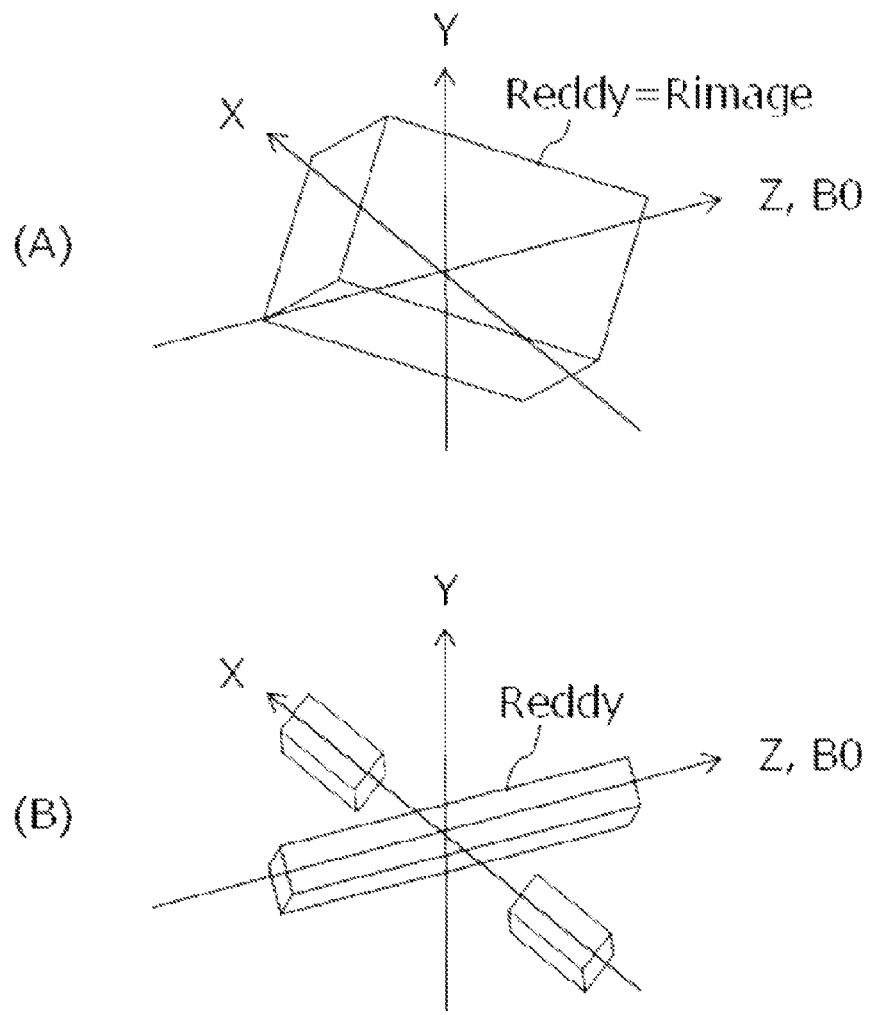
FIG. 5 is a view showing examples of acquisition region of MR signals, for obtaining eddy magnetic field information, set in the imaging condition setting unit shown in FIG. 2.

FIG. 5 is a view showing examples of acquisition region of MR signals, for obtaining eddy magnetic field information, set in the imaging condition setting unit 40 shown in FIG. 2.

In FIGS. 5 (A) and (B), X-axis, Y-axis and Z-axis are spatial axes set in a field of view respectively. Each of FIGS. 5 (A) and (B) shows an example where Z-axis is directed to a static magnetic field (B0) direction. FIG. 5 (A) shows an example of setting a data acquisition region Reddy of MR signals for obtaining eddy magnetic field information so as to become same as an imaging region Rimage for imaging. When the data acquisition region Reddy of the MR signals for obtaining the eddy magnetic field information is set as mentioned above, the eddy magnetic field information corresponding to the imaging region Rimage can be obtained with high accuracy.

Meanwhile, FIG. 5 (B) shows an example of setting data acquisition regions Reddy of MR signals for obtaining eddy magnetic field information as regions around the X-axis and the Z-axis. As mentioned above, when MR signals for obtaining eddy magnetic field information are acquired from only reference regions, it is possible to lead to reduction of a data acquisition time and an amount of data acquisition.

Next, other functions of the computer 32 will be described.

The data processing unit 41 has a function to obtain necessary data such as information on eddy magnetic fields or MR image data by obtaining MR signals from the sequence controller 31 and performing data processing of the MR signals.

The eddy magnetic field measuring part 41A has a function to obtain MR signals, acquired for obtaining eddy magnetic field information, from the sequence controller 31 to obtain the eddy magnetic field information including intensities, time constants and a spatial distribution of eddy magnetic fields based on phase information of the MR signals.

When MR signals for obtaining eddy magnetic field information have been acquired corresponding to eddy generation gradient magnetic field pulses Geddy having plural intensities as shown in FIG. 3 or FIG. 4, phase subtraction data from MR signals corresponding to a reference eddy generation gradient magnetic field pulse Geddy is obtained. For example, when MR signals corresponding to two kinds of eddy generation gradient magnetic field pulses Geddy have been acquired, subtraction values in phase data are obtained.

Consequently, phase shift amounts due to factors, such as non-uniformity of a static magnetic field, except to $T2^*$ can be canceled to obtain a time change of each phase shift amount due to eddy magnetic fields. Then, it becomes possible to obtain eddy magnetic field information such as time constants of the eddy magnetic fields based on the time changes of the subtraction values in the phase data.

Figure 6:
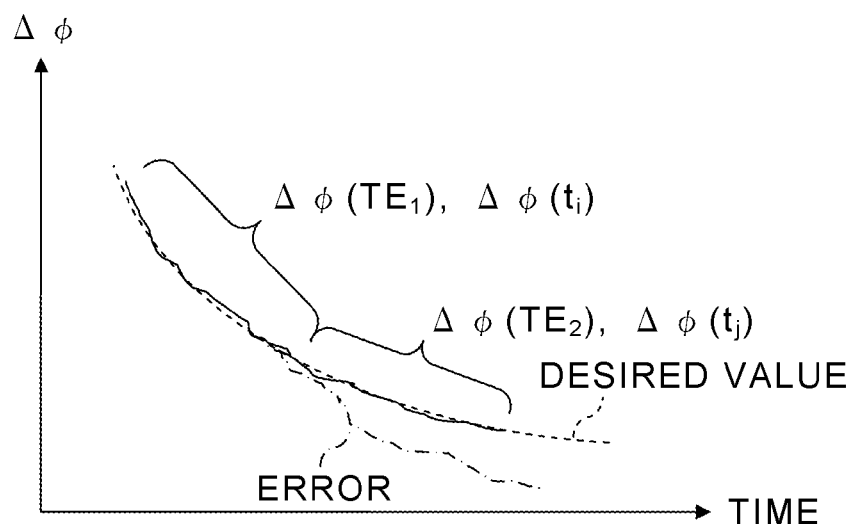
FIG. 6 is a graph showing an example of plot data representing a relation between a phase shift amount, obtained in the eddy magnetic field measuring part shown in FIG. 2, and time.

FIG. 6 is a graph showing an example of plot data representing a relation between a phase shift amount, obtained in the eddy magnetic field measuring part 41A shown in FIG. 2, and time.

In FIG. 6, the transverse axis shows time and the vertical axis shows phase differences $\Delta\phi$ of MR signals corresponding to mutually different eddy generation gradient magnetic field pulses Geddy and −Geddy respectively. When the phase differences $\Delta\phi$ of the time series MR signals corresponding to the mutually different eddy generation gradient magnetic field pulses Geddy and −Geddy are obtained to plot them in the time direction, a curve as shown as a solid line can be generated.

For example, in a case of acquiring MR signals under the data acquisition conditions by the SE sequences shown in FIG. 3, phase difference data $\Delta\phi$ ($TE_1$) between the reception data $DATA_1(TE_1)$ and $DATA_2(TE_1)$ acquired in a period including the first echo time $TE_1$ with application of the eddy generation gradient magnetic field pulses Geddy and −Geddy having mutually inverted polarities and phase difference data $\Delta\phi$ ($TE_2$) between the reception data $DATA_1(TE_2)$ and $DATA_2(TE_2)$ acquired in a period including the second echo time $TE_2$ with application of the eddy generation gradient magnetic field pulses Geddy and −Geddy having mutually inverted polarities are obtained respectively.

Then, each of the pieces of phase difference data $\Delta\phi$ ($TE_1$) and $\Delta\phi$ ($TE_2$) is equivalent to differences in intensity between the eddy generation gradient magnetic field pulses Geddy and −Geddy having mutually inverted polarities, i.e., integral quantities of phase shifts by eddy magnetic fields generated by a gradient magnetic field having twice area of each of the eddy generation gradient magnetic field pulses Geddy and −Geddy. When the pieces of phase difference data $\Delta\phi$ ($TE_1$) and $\Delta\phi$ ($TE_2$) are plotted in the time axis direction, a variation curve which attenuates in the time axis direction can be obtained. Subsequently, when the phase difference data $\Delta\phi$ ($TE_1$) is combined with the phase difference data $\Delta\phi$ ($TE_2$), an attenuation curve having a sufficient length to obtain a time constant can be obtained as shown by the solid line in FIG. 6.

The dotted line in FIG. 6 shows an ideal attenuation curve. If an attenuation curve having a sufficient length is attempted to obtain by acquiring MR signals with a single TE, a data acquisition period becomes long. In this case, the MR signals are influenced by the T2* attenuation and phases of the MR signals are shifted. Accordingly, a curve generated by plotting the phase difference data $\Delta\phi$ in the time axis direction may become inaccurate as a chain line.

To the contrary, when data acquisition is performed by dividing into periods including two TEs with the SE sequences as shown in FIG. 3, an attenuation curve similar to an ideal curve can be obtained with no influence of the T2* attenuation. Therefore, when data acquisition is performed with setting more than two TEs, an attenuation curve can be obtained by combination of phase difference data trains whose number is that of TEs.

When an attenuation curve of phase difference data $\Delta\phi$ ($TE_1$) and $\Delta\phi$ ($TE_2$) has been obtained, a time constant of an eddy magnetic field can be obtained as a time constant of the attenuation curve. Further, intensities of the eddy magnetic field can be also obtained based on a relation between a phase difference and an eddy magnetic field intensity. That is, intensities and a time constant of eddy magnetic field can be obtained as fitting parameters respectively by curve fitting of pieces of phase difference data $\Delta\phi$ ($TE_1$) and $\Delta\phi$ ($TE_2$) at respective data acquisition times to a curve representing an attenuation of an eddy magnetic field intensity.

FIG. 6 shows a time change of phase difference data $\Delta\phi$ ($TE_1$) and $\Delta\phi$ ($TE_2$) at a certain point in a space. When gradient magnetic field pulses for PE are applied in the SE sequences shown in FIG. 3, a phase difference distribution in a PE axis direction is obtained. Therefore, spatial information of intensities and time constants of eddy magnetic fields including the PE axis direction can be obtained.

Similarly, when data acquisition for obtaining eddy magnetic field information is performed by the EPI sequences shown in FIG. 4, an attenuation curve of phase difference data $\Delta\phi$ having a sufficient length to obtain a time constant can be obtained.

More specifically, pieces of MR data corresponding to the elapsed times $t_i$ and $t_j$ from the application termination timings of the MPG pulses $G_{MPG}$ and $-G_{MPG}$ can be obtained by Fourier transform (FT) of echo data acquired by the respective EPI sequences shown in FIGS. 4 (A), (B), (C) and (D) respectively to disassemble the echo data in a frequency encode direction. In each EPI sequence, phase encode is performed by controlling step-shaped PE gradient magnetic field pulses. Therefore, the reception data $DATA_1(t_i)$, $DATA_1(t_j)$, $DATA_2(t_i)$ and $DATA_2(t_j)$ corresponding to the elapses times $t_i$ and $t_j$ and respective phase encode amounts can be obtained by FT of the pieces of the MR data, corresponding to the elapsed times $t_i$ and $t_j$, in the PE direction to disassemble the MR data in the PE direction.

Each of the pieces of obtained reception data $DATA_1(t_i)$, $DATA_1(t_j)$, $DATA_2(t_i)$ and $DATA_2(t_j)$ becomes image data corresponding to respective pixels in a space. Therefore, eddy magnetic field information with regard to positions corresponding to the respective pixels can be obtained. That is, intensities, time constants and a special distribution of the eddy magnetic fields can be obtained.

Calculating eddy magnetic field information can be performed for every spatial position with a similar method to that in the case of using the reception data $DATA_1(TE_2)$ and $DATA_2(TE_2)$ acquired by the SE sequences shown in FIG. 3. That is, pieces of the phase difference data $\Delta\phi$ ($t_i$) and $\Delta\phi$ ($t_j$) between the reception data $DATA_1(t_i)$ and $DATA_1(t_j)$ acquired with application of the MPG pulse $G_{MPG}$ having the positive polarity and the reception data $DATA_2(t_i)$ and $DATA_2(t_j)$ acquired with application of the MPG pulse $-G_{MPG}$ having the negative polarity are calculated. Then, an attenuation curve as shown in FIG. 6 can be obtained for every position in the PE axis direction by combination and plotting of the phase difference data $\Delta\phi$ ($t_i$) and $\Delta\phi$ ($t_j$) corresponding to the respective elapsed times $t_i$ and $t_j$ from the application termination timings of the MPG pulses $G_{MPG}$ and $-G_{MPG}$.

Subsequently, time constants of eddy magnetic fields can be obtained for every position in the PE axis direction based on the obtained attenuation curves. In addition, a time change in intensity of an eddy magnetic field can be obtained for every position in the PE axis direction based on the phase difference data $\Delta\phi$ ($t_i$) and $\Delta\phi$ ($t_j$).

On the other hand, when a time-series MR signal train corresponding to an eddy generation gradient magnetic field pulse Geddy having a single intensity has been acquired, an attenuation curve as shown in FIG. 6 can be obtained by plotting phases of the respective MR signals in order of the elapsed time from an application time of the eddy generation gradient magnetic field pulse Geddy. Then, a time constant of an eddy magnetic field can be obtained based on the attenuation curve. When phase encode has been performed, spatial distributions of intensities and time constants of eddy magnetic fields corresponding to positions in the PE axis direction can be obtained.

The image data generating part 41B has a function to obtain MR signals acquired for imaging from the sequence controller 31 to arrange the MR signals as k-space data in a k-space formed in the k-space data storage unit 42, a function to read k-space data from the k-space data storage unit 42 to reconstruct image data by image reconstruction processing including FT of the k-space data, a function to write image data in the image data storage unit 43 and read image data from the image data storage unit 43 to display the image data on the display unit 34 with performing necessary image processing.

In addition, a function to perform correction processing, such as phase correction and/or strain correction, of imaging data or image data based on eddy magnetic field information obtained in the eddy magnetic field measuring part 41A may be provided with the image data generating part 41B, as needed.

Next, operation and action of the magnetic resonance imaging apparatus 20 will be described.

Firstly, a case of acquiring MR signals from an imaging region to obtain spatial eddy magnetic field information including intensities and time constants of eddy magnetic fields prior to imaging and subsequently performing imaging under imaging conditions according to the obtained eddy magnetic field information will be described.

FIG. 7 is a flow chart showing a flow for imaging with measuring intensities and time constants of eddy magnetic fields by the magnetic resonance imaging apparatus 20 shown in FIG. 1.

Firstly, in step S1, an imaging region is set. That is, information designating the imaging region for imaging is inputted in the imaging condition setting unit 40. Then, the imaging condition setting unit 40 sets the imaging region in accordance with the designating information.

Next, in step S2, the imaging condition setting unit 40 automatically sets a region same as the imaging region to an acquisition region of MR signals for obtaining eddy magnetic field information as shown in FIG. 5 (A), for example.

Next, in step S3, pulse sequences for acquiring MR signals with mutually different plural TEs are set in the imaging condition setting unit 40 according to the acquisition region of the MR signals for obtaining the eddy magnetic field information. For example, plural SE sequences with mutually different TEs and with applying eddy generation gradient magnetic field pulses Geddy and −Geddy as shown in FIG. 3 are set for obtaining the eddy magnetic field information. Alternatively, plural EPI sequences at least with mutually different TEs and with applying MPG pulses $G_{MPG}$ and $-G_{MPG}$ as shown in FIG. 4 are set. In the case of the EPI sequences shown in FIG. 4, each time difference between an elapsed timing of TE and an acquisition timing of reception data is also changed into plural values, as needed.

Next, in step S4, MR signals for obtaining eddy magnetic field information are acquired according to pulse sequences for obtaining the eddy magnetic field information.

For that purpose, an object P is set on the bed 37 in advance, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction starting data acquisition to the imaging condition setting unit 40. The imaging condition setting unit 40 outputs the imaging conditions including pulse sequences to the sequence controller 31. Therefore, the sequence controller 31 drives the gradient power supply 27, the transmitter 29, and the receiver 30 in accordance with the pulse sequences, thereby generating gradient magnetic fields at the imaging area having the set object P, and further generating RF signals from the RF coil 24.

Consequently, the RF coil 24 receives MR signals generated due to magnetic resonance in the object P. Then, the receiver 30 receives the MR signals from the RF coil 24 and generates raw data which is digital data of MR signals by A/D conversion subsequently to necessary signal processing.

Then, the receiver 30 supplies the MR signals to the sequence controller 31. The sequence controller 31 outputs the MR signals to the computer 32.

Next, in step S5, the eddy magnetic field measuring part 41A calculates the eddy magnetic field information such as intensities, time constants and a spatial distribution of eddy magnetic fields. That is, the eddy magnetic field measuring part 41A obtains the MR signals from the sequence controller 31. When data for obtaining the eddy magnetic field information has been acquired for each of eddy generation gradient magnetic field pulses having mutually different intensities, phase difference data $\Delta\phi$ between pieces of reception data corresponding to the intensities of the eddy generation gradient magnetic field pulses is obtained.

Next, the pieces of phase difference data $\Delta\phi$ or the phases of reception data corresponding to the mutually different TEs are plotted in the time axis direction. Consequently, an attenuation curve as shown in FIG. 6 is obtained. In a case of performing phase encode, attenuation curves can be obtained for respective positions in the PE axis direction by FT in the PE direction. Then, time constants of eddy magnetic fields can be obtained as time constants of the attenuation curves. In addition, intensities of the eddy magnetic fields can be obtained based on phase information of the reception data.

The eddy magnetic field information obtained as described above can be used for setting imaging conditions and data processing conditions for an imaging scan. For example, the eddy magnetic field information can be used as parameter information for compensating eddy magnetic fields in an imaging scan and/or reference information for eddy magnetic field correction of acquired data.

In addition, the eddy magnetic field information can be used as parameters for an eddy compensation circuit included in the gradient power supply 27. In this case, values such as time constants of eddy magnetic fields are inputted to the eddy compensation circuit as control parameters so as to be referred for eddy compensation processing in the eddy compensation circuit.

Next, in step S6, imaging conditions for an imaging scan are set in the imaging condition setting unit 40. Conditions for compensating the eddy magnetic fields can be included in the imaging conditions, as needed. For example, imaging conditions, in which gradient magnetic fields are adjusted so as to cancel eddy magnetic fields with using time constants of eddy magnetic fields according to intensities of the gradient magnetic fields as parameters, can be set for imaging.

Next, in step S7, imaging is performed. That is, MR data for imaging is acquired according to the imaging conditions set in step S6 in a flow similarly to that for acquisition of the MR data for obtaining the eddy magnetic field information.

Then, The imaging data generating part 41B arranges the MR signals acquired for imaging, which are obtained from the sequence controller 31, as k-space data in the k-space formed in the k-space data storage unit 42. Next, the image data generating part 41B reconstructs image data by reading the k-space data from the k-space data storage unit 42 to perform image reconstruction processing including FT of the k-space data. Subsequently, the image data generating part 41B performs needed image processing to the image data and displays the image data on the display unit 34. Further, the image data is stored in the image data storage unit 43 as needed.

The image data generated as described above is compensated the eddy magnetic fields using the eddy magnetic field information including the time constants of the eddy magnetic fields measured with high accuracy based on the data acquired in the period in which the influence of the T2* attenuation is negligible. Therefore, the image data can be obtained as image data with satisfactory image quality.

Next, a case of acquiring MR signals from a designated area to obtain eddy magnetic field information as a regular operation will be described.

FIG. 8 is a flow chart showing a flow for measuring intensities and time constants of eddy magnetic fields to store the intensities and the time constants as apparatus parameters for compensating eddy magnetic fields by the magnetic resonance imaging apparatus 20 shown in FIG. 1. Note that, the description of each step in FIG. 8 similar to a step shown in FIG. 7 will be omitted using the same signs.

In a case of obtaining eddy magnetic field information which is not performed for every imaging, an imaging region is not set. Therefore, in step S1', a data acquisition region for the eddy magnetic field information is set. Specifically, information designating a data acquisition region or data acquisition regions for eddy magnetic field information as shown in FIG. 5 (A) or (B) is inputted from the input device 33 to the imaging condition setting unit 40. Then, the imaging condition setting unit 40 sets at least one data acquisition region for the eddy magnetic field information according to the designating information.

As shown in FIG. 5 (A), when a range which is possible to be set as an imaging region is set as a data acquisition region for eddy magnetic field information, it becomes to obtain eddy magnetic field information with higher accuracy. Meanwhile, as shown in FIG. 5 (B), data for eddy magnetic field information may be acquired from limited regions so that eddy magnetic field information in a large range can be obtained by calculation such as fitting. In this case, it becomes possible to obtain eddy magnetic field information with a less data amount and a less data acquisition time.

Then, eddy magnetic field information including intensities, time constants and a spatial distribution of eddy magnetic fields is obtained with a flow similar to that in a case of calculation executed prior to imaging. the obtained eddy magnetic field information is stored as apparatus parameters for compensating eddy magnetic fields in the storage unit 36 in step S6'.

The apparatus parameters for compensating eddy magnetic fields stored in the storage unit 36 can be used for correcting gradient magnetic field waveforms in the eddy compensating circuit included in the gradient power supply 27 and/or the sequence controller 31. For that purpose, the apparatus parameters for compensating eddy magnetic fields stored in the storage unit 36 are outputted to the predetermined elements of the magnetic resonance imaging apparatus 20 from the computer 32 directly or indirectly.

The magnetic resonance imaging apparatus 20 described above is an apparatus configured to acquire plural time-series MR data sets in periods in which the influence of T2* attenuation is negligible by setting data acquisition conditions with mutually different TEs and obtain information such as time constants of eddy currents due to applying gradient magnetic fields, using phase shift information of data obtained by combination of the acquired plural MR data sets.

Therefore, the magnetic resonance imaging apparatus 20 can avoid an influence of T2* attenuation to obtain intensities, time constants and spatial information of eddy magnetic fields even under a high magnetic field. Especially, eddy magnetic field information with regard to an eddy magnetic field having a time constant from 0.2 [ms] to 30 [ms] approximately can be measured with high accuracy. Therefore, eddy magnetic field information can be measured effectively for DWI of which data acquisition time is equivalent to a period in which an influence of T2* attenuation occurs. Then, an image quality can be improved by improving an accuracy of eddy magnetic field information.

Second Embodiment

In the magnetic resonance imaging apparatus of the second embodiment, data acquisition conditions set by the imaging condition setting unit for acquisition of eddy magnetic field information and a data processing method for acquisition of the eddy magnetic field information performed by the eddy magnetic field measuring part are different from those in the magnetic resonance imaging apparatus 20 of the first embodiment. Other configuration and operation are similarly to those of the magnetic resonance imaging apparatus 20 of the first embodiment. Therefore, descriptions thereof are omitted.

In the first embodiment, the example of acquiring MR signals for acquisition of the eddy magnetic field information using plural pulse sequences corresponding to mutually different plural TEs has been described. However, MR signals for acquisition of eddy magnetic field information may be acquired using a single or plural pulse sequences corresponding to a single TE.

Specifically, the imaging condition setting unit can set a data acquisition condition for acquisition of eddy magnetic field information as a pulse sequence for applying a 180 degree RF inversion pulse at a timing when TE/2 elapses from an application timing of a 90 degree RF excitation pulse and applying eddy generation gradient pulses Geddy, having intensities considered to be mutually same, before and after applying the 180 degree RF inversion pulse. This condition corresponds to a case of fixing the TE to a single value in the condition shown in FIG. 3 or FIG. 4 instead of varying the TE into the first TE ($TE_1$, $TE_{1i}$) and the second TE ($TE_2$, $TE_{2j}$).

Therefore, it is possible to set a data acquisition condition for acquisition of eddy magnetic field information as pulse sequences for applying eddy generation gradient pulses Geddy (which may be MPG pulses $G_{MPG}$) having mutually different intensities in a way of inverting eddy generation gradient pulses Geddy without changing the TE, similarly to the example shown in FIG. 3 or FIG. 4, or the like. Hence, in case of setting pulse sequences for applying eddy generation gradient pulses Geddy having mutually different intensities without changing the TE, plural pulse sequences corresponding to the single TE are to be set for acquisition of eddy magnetic field information. Meanwhile, when eddy generation gradient pulses Geddy having mutually different intensities are not applied, a single pulse sequence corresponding to the single TE is to be set for acquisition of eddy magnetic field information.

By setting such a data acquisition condition by the imaging condition setting unit to acquire data with applying eddy generation gradient pulses Geddy, time series MR signals corresponding to mutually different timings can be acquired. That is, MR signals can be acquired at mutually different elapsed times from application timing of each eddy generation gradient pulse Geddy.

When time series MR signals corresponding to eddy generation gradient pulses Geddy having plural intensities have been acquired, the eddy magnetic field measuring part calculates phase difference data Δϕ between signals corresponding to the different intensities of the eddy generation gradient pulses Geddy. By plotting the phase difference data Δϕ in the order of elapsed times from an application time of one eddy generation gradient pulse Geddy, an attenuation curve of the phase difference data Δϕ corresponding to one TE shown in FIG. 6 can be obtained.

Meanwhile, when time series MR signals corresponding to an eddy generation gradient pulse Geddy having a single intensity have been acquired, phases of the respective MR signals are plotted in the order of elapsed times from the application time of the eddy generation gradient pulse Geddy. Consequently, a similar attenuation curve of the phases corresponding to a single TE can be obtained.

Therefore, a time constant of an eddy magnetic field can be calculated as a time constant of the attenuation curve of the phase difference data Δϕ or the phases. In addition, intensities of the eddy magnetic field can be also calculated based on the relationship between a phase difference or a phase and an eddy magnetic field intensity.

Note that, eddy magnetic field information can be acquired as two dimensional information by acquiring respective MR signals of which phases or phase difference data are to be plotted with setting the PE amount to zero similarly to the first embodiment. Meanwhile, when plural MR signals corresponding to mutually different PE amounts are acquired at a same data acquisition timing, eddy magnetic field information can be acquired as spatial information including a PE axis direction. As a concrete example, acquiring MR signals under the conditions for applying RO gradient pulses and PE gradient pulses as shown in FIG. 4 can acquire spatial eddy magnetic field information.

By the magnetic resonance imaging apparatus of the second embodiment as described above, MR data necessary for acquiring eddy magnetic field information can be acquired in a shorter time because of a single value of TE. Therefore, increase in a data acquisition amount and a data acquisition time can be suppressed even though a same region as an imaging region is set as a data acquisition region for acquisition of eddy magnetic field information as shown in FIG. 5 (A).

Hence, the magnetic resonance imaging apparatus of the second embodiment is effective for a case where the influence of T2* attenuation is negligible, especially under about 1.5 T of magnetic field. That is, spatial eddy magnetic field information corresponding to an imaging region can be acquired in a practical data acquisition time. As a result, eddy compensation can be performed with high accuracy.

Other Embodiments

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a data acquisition unit configured to acquire magnetic resonance signals at mutually different timings by repeating a sequence, wherein the sequence includes (1) generating at least one magnetic resonance signal and acquiring at least a part of generated magnetic resonance signals, (2) applying a radio frequency inversion pulse at a timing when half of an echo time elapses from a timing of applying a radio frequency excitation pulse, and (3) applying a gradient magnetic field for generating an eddy magnetic field after and before applying the radio frequency inversion pulse, and wherein the sequence is repeated but with a different time period from an application of the gradient magnetic field to an acquisition of magnetic resonance signals to be acquired;
an eddy magnetic field measuring unit configured to acquire eddy magnetic field information including a time constant of the eddy magnetic field based on phase information of the magnetic resonance signals acquired at the different timings of acquired magnetic resonance signals; and
an imaging unit configured to perform imaging under an imaging condition or a data processing condition according to the eddy magnetic field information.

2. A magnetic resonance imaging apparatus of claim 1, wherein said data acquisition unit is configured to acquire the magnetic resonance signals at mutually different timings corresponding to each of mutually different echo times.

3. A magnetic resonance imaging apparatus of claim 1, wherein said data acquisition unit is configured to apply the gradient pulses after and before applying the radio frequency inversion pulse such that the gradient pulses have intensities considered to be mutually same, the gradient pulses forming the gradient magnetic field for generating the eddy magnetic field.

4. A magnetic resonance imaging apparatus of claim 1, wherein said data acquisition unit is configured to acquire the magnetic resonance signals from a same region as an imaging region for the imaging.

5. A magnetic resonance imaging apparatus of claim 4, wherein said data acquisition unit is configured to automatically set the same region for acquiring the magnetic resonance signals according to information designating the imaging region for the imaging.

6. A magnetic resonance imaging apparatus of claim 1, wherein said data acquisition unit is configured to acquire the magnetic resonance signals under a spin echo method while applying a motion probing gradient forming the gradient magnetic field for generating the eddy magnetic field.

7. A magnetic resonance imaging apparatus of claim 2, wherein said data acquisition unit is configured to acquire the magnetic resonance signals by changing a time difference between pairs of timings, each of the pairs comprising a timing of an echo time and one of the different timings corresponding to the echo time.

8. A magnetic resonance imaging apparatus of claim 1, wherein said data acquisition unit is configured to acquire the magnetic resonance signals in a period without applying a gradient magnetic field under a spin echo method.

9. A magnetic resonance imaging apparatus of claim 1, wherein said data acquisition unit is configured to acquire the magnetic resonance signals while changing a phase encode amount, and
said eddy magnetic field measuring unit is configured to acquire a spatial distribution of the eddy magnetic field, the spatial distribution including a phase encode direction.

10. A magnetic resonance imaging apparatus of claim 1, wherein said data acquisition unit is configured to acquire the magnetic resonance signals by applying a gradient magnetic field for a readout at a same timing as a timing of applying a gradient magnetic field for a readout for the imaging and applying the gradient magnetic field for generating the eddy magnetic field at a same timing as a timing of applying a predetermined gradient magnetic field for the imaging, wherein the predetermined gradient magnetic field is different from the gradient magnetic field for the readout for the imaging.

11. A magnetic resonance imaging apparatus of claim 10, wherein said data acquisition unit is configured to apply the gradient magnetic field for the readout for acquiring the magnetic resonance signals with a same intensity as an intensity of the gradient magnetic field for the readout for the imaging and apply the gradient magnetic field for generating the eddy magnetic field with a same intensity as an intensity of the predetermined gradient magnetic field for the imaging.

12. A magnetic resonance imaging apparatus of claim 1, wherein said data acquisition unit is configured to acquire the magnetic resonance signals from a reference region narrower than an imaging region for the imaging.

13. A magnetic resonance imaging apparatus of claim 2, wherein said data acquisition unit is configured to acquire the magnetic resonance signals according to pulse sequences corresponding to the echo times.

14. A magnetic resonance imaging method comprising:
acquiring magnetic resonance signals at mutually different timings by repeating a sequence, wherein the sequence includes (1) generating at least one magnetic resonance signal and acquiring at least a part of generated magnetic resonance signals, (2) applying a radio frequency inversion pulse at a timing when half of an echo time elapses from a timing of applying a radio frequency excitation pulse, and (3) applying a gradient magnetic field for generating an eddy magnetic field after and before applying the radio frequency inversion pulse, and wherein the sequence is repeated but with a different period from an application of the gradient magnetic field to an acquisition of magnetic resonance signals to be acquired;

acquiring eddy magnetic field information including a time constant of the eddy magnetic field based on phase information of the magnetic resonance signals acquired at the different timings of acquired magnetic resonance signals; and performing imaging under an imaging condition or a data processing condition according to the eddy magnetic field information.

\* \* \* \* \*